United States Patent
Wetzel

[11] Patent Number: 6,143,646
[45] Date of Patent: Nov. 7, 2000

[54] DUAL IN-LAID INTEGRATED CIRCUIT STRUCTURE WITH SELECTIVELY POSITIONED LOW-K DIELECTRIC ISOLATION AND METHOD OF FORMATION

[75] Inventor: Jeffrey Thomas Wetzel, Austin, Tex.

[73] Assignee: Motorola Inc., Schaumburg, Ill.

[21] Appl. No.: 08/868,332

[22] Filed: Jun. 3, 1997

[51] Int. Cl.[7] .............................................. H01L 21/4763
[52] U.S. Cl. ..................... 438/637; 438/622; 438/228; 438/175; 437/228
[58] Field of Search .................................. 438/637, 622, 438/228, 175; 437/228

[56] References Cited

U.S. PATENT DOCUMENTS

| | | | |
|---|---|---|---|
| 3,944,447 | 3/1976 | Magdo et al. | 148/175 |
| 5,204,288 | 4/1993 | Marks et al. | 437/228 |
| 5,510,645 | 4/1996 | Fitch et al. | 257/522 |
| 5,880,018 | 3/1999 | Boeck et al. | 438/619 |

OTHER PUBLICATIONS

R. V. Joshi, et al., "A Novel Application of Polyimide–W–Al/Cu for VLSI Interconnect", Jun. 11–12, 1991 VMIC Conference, pp. 75–81.

*Primary Examiner*—Richard Elms
*Assistant Examiner*—Pho Luu

[57] ABSTRACT

A method for forming a dual inlaid contact structure (damascene) begins by etching dual inlaid contact structures (32, 34, and 36). Masking layers (28) are (228) and the deposition of low-K dielectric material 26 is used to selectively form low-K regions (30) only in critical areas where low-K dielectric material is absolutely needed. Other portions of the wafer remain covered with conventional oxide (24) so that adverse impacts of low-K dielectric material is minimized. Conductive material (38, 40, and 42) is then formed to complete dual inlaid contact structures whereby low-K dielectric plugs (30) reduce cross talk and capacitance within the final structure.

20 Claims, 11 Drawing Sheets

DUAL IN-LAID INTEGRATED CIRCUIT STRUCTURE WITH SELECTIVELY POSITIONED LOW-K DIELECTRIC ISOLATION AND METHOD OF FORMATION

FIELD OF THE INVENTION

The present invention relates generally to semiconductor manufacturing, and more particularly to, forming dual inlaid integrated circuit (IC) contacts having selectively-placed low-K dielectric regions.

BACKGROUND OF THE INVENTION

A common goal in the integrated circuit (IC) industry is to continually strive to place more conductive circuitry into a smaller substrate surface area. As conductive elements are manufactured in closer proximity to one another to achieve this goal, cross-talk due to capacitive coupling between adjacent electrical devices increases greatly whereby device performance and product integrity is affected. To battle this increase in cross-talk and capacitive coupling between adjacent conductive members, the industry has begun to incorporate low-K dielectrics into integrated circuits (ICs) to provide improved electrical isolation between adjacent conductive regions of integrated circuit (IC) material.

When low-K dielectric material were first introduced in the IC industry, all low-K dielectric materials were blanketly deposited over the entire integrated circuit wafer in place of some conventional higher-K dielectric material. It was soon discovered that this blanket deposition of low-K material was not optimal. First, low-K dielectric materials, while providing improved electrical isolation between adjacent conductive elements, suffered from a lower mechanical strength than conventional higher-K dielectric materials. In addition, many low-K dielectric materials cannot survive high temperature processing, whereby the use of low-K dielectric materials significantly hinders subsequent IC thermal processing. Also, low-K dielectric materials have poor thermal conductivity. In fact, some low-K dielectric materials are five times less thermally conductive than conventional higher-K dielectrics such as silicon dioxide ($SiO_2$). Therefore, when a low-K dielectric is blanketly deposited across the surface of an integrated circuit, this low-K dielectric layer tends to prevent heat dissipation from the products thereby resulting in elevated temperatures in active circuit regions of the integrated circuit (IC). In addition, many low-K dielectric materials suffer from a larger level of moisture absorption than other conventional dielectric materials. All of moisture absorption, out-gassing, low-K dielectric material flow over time, and geometrical changes in low-K dielectric shape during processing are serious concerns when using low-K material in the integrated circuit industry. In addition, many low-K dielectric materials have been documented as having poor adhesion characteristics and do not adequately adhere to other conventional integrated circuit (IC) materials such as conventional dielectrics and conventional metallic interconnect materials.

FIG. 1 illustrates a blanketly-deposited low-K dielectric embodiment which is known in the integrated circuit (IC) art. FIG. 1 illustrates three conductive metallic members 450, 451, and 452. These three conductive members 450–452 are encapsulated by a thin tetraethylorthosilicate (TEOS) layer 454. After formation of the layer 454, a blanket layer of low-K dielectric material 456 is deposited as illustrated in FIG. 1. After deposition of the layer 456, the blanket low-K dielectric layer 456 is followed with a second TEOS deposition step to form the TEOS layer 458 of FIG. 1. One or more contact openings 466 are etched through the layers 458, 456, and 454. The contact opening 466 is typically plugged with a conductive material such as tungsten (W). A second metallic layer is sputtered and patterned to form second-level conductive members 462 as illustrated in FIG. 1. As previously discussed, the layer 456 is a blanket layer of low-K dielectric material which suffers from lower mechanical strength, temperature limitations, lower thermal conductivity, moisture absorption, poor adhesion to other layers, and other disadvantages. Therefore, the blanket deposition of low-K dielectric materials, as illustrated in FIG. 1, is not optimal in the integrated circuit industry.

FIGS. 2–5 illustrate an alternate embodiment which has been used in the integrated circuit (IC) art to reduce the disadvantages discussed above with respect to blanketly-deposited low-K dielectric materials. The integrated circuit industry has recognized that the disadvantages/limitations of low-K dielectric materials can be lessened in impact if the use of low-K dielectric materials occurs in only select portions of an integrated circuit (IC) design. In other words, by forming low-K dielectric material in a non-blanketed manner only in critical areas of necessity, some of the effects of the low-K dielectric material's low mechanical strength, temperature limitations, lower thermal conductivity, moisture absorption, and poor adhesion, can either be avoided or reduced to within acceptable levels.

One method used to incorporate low-K dielectric material into a semiconductor structure in a manner that is non-blanket in configuration is illustrated in FIGS. 2–5. In FIG. 2, a base oxide layer 412 is provided. Conductive interconnects 414, 416, and 418 are formed overlying the oxide layer 412. At first, a blanket layer of low-K dielectric material 420 is deposited over the wafer as illustrated in FIG. 1. This layer 420 is then exposed to reactive ion etch (RIE) environment which etches the layer 420 into spacer formations 420 as illustrated in FIG. 3.

In FIG. 3, the low-K dielectric spacer structures 420 are not blanket in nature and therefore do not have as large of an adverse impact in integrated circuit mechanical strength, thermal conductivity, moisture absorption, and the like. In FIG. 3, the low-K dielectric and metal layers are then encapsulated via an oxide layer 422. In FIG. 3, conventional openings 426 are then etched through the dielectric layer 422 to form electrical contact openings which expose the conductive members 418, 416, and 414. Conductive plugs 430 and metal lines 432 and 434 are patterned in FIG. 5 to complete the electrical interconnection structures.

It is important to note that FIGS. 2–5 illustrate a conventional contact and interconnect process whereby metal lines are lithographically patterned and etched overlying existing oxide layers. This type of conventional interconnection formation is generally being phased out of the integrated circuit industry. A new process and structure, referred to as Damascene contacts or dual inlaid metal interconnects, are now being used in the IC industry. These dual inlaid contacts do not have exposed vertical sidewalls of conductive material such as the vertical sidewalls of the regions 414, 416, and 418 of FIG. 2. Since Damascene or dual inlaid structures do not have exposed metallic sidewalls, the formation of sidewall spacers laterally adjacent metal lines as illustrated in FIGS. 2–5 is not possible in Damascene or dual inlaid processing. Therefore, the process of FIGS. 2–5 cannot be utilized to form adequate low-K dielectric material in accordance with dual inlaid processing.

The need exists for a low-K dielectric process for Damascene contacts (dual inlaid contact) which selectively places low-K dielectric material where it is most needed whereby its selective placement will reduce some of the inherent weaknesses with low-K dielectric materials, such as the material's lower mechanical strength, its lower thermal conductivity, its moisture absorption, and the like.

Figure 1:
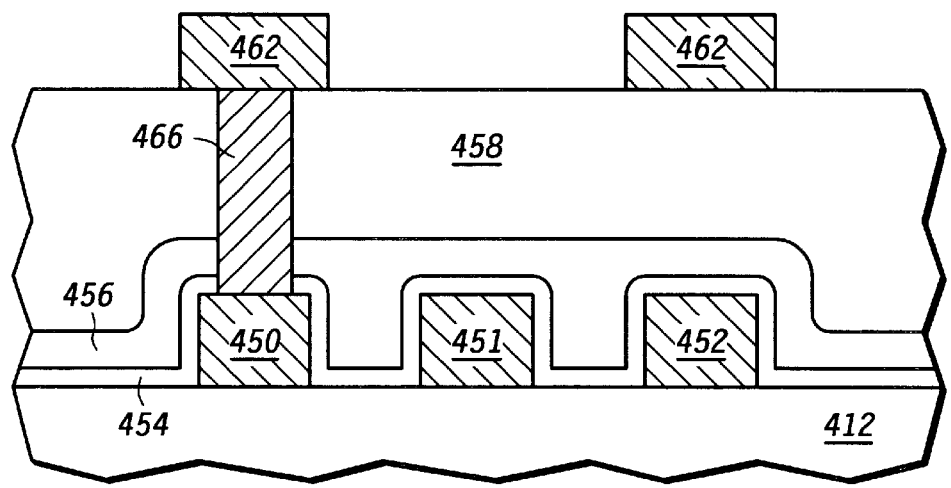
FIG. 1 illustrates, in a cross-sectional diagram, a prior art method for blanketly depositing a low-K dielectric over the surface of an integrated circuit (IC).
Figure 2:
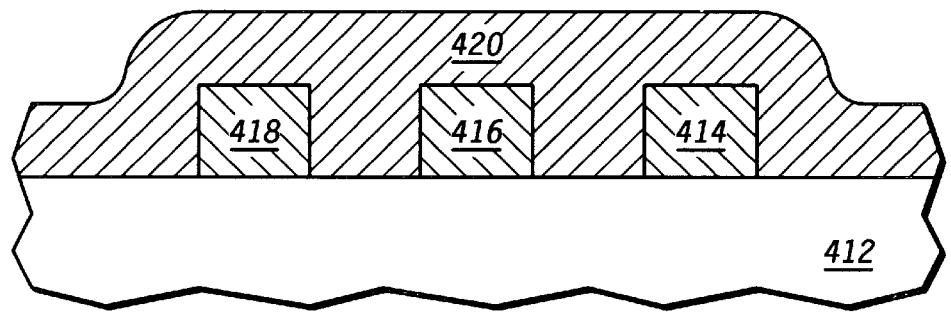
FIGS. 2–5 illustrate, in cross-sectional diagrams, another prior art embodiment for forming a low-K dielectric material adjacent to metal conductors.
Figure 3:
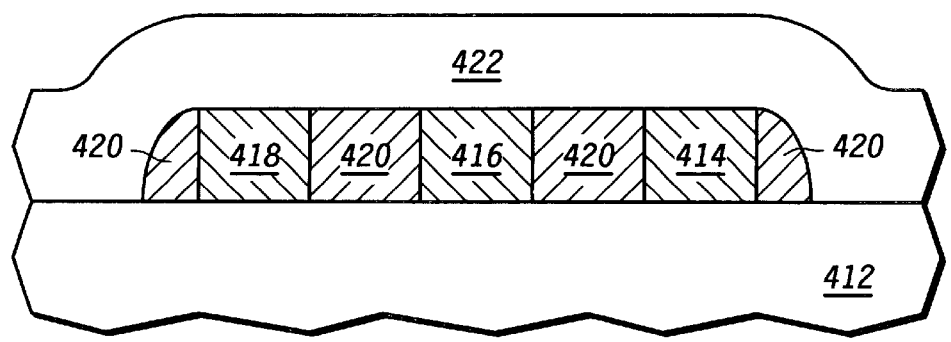

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF A PREFERRED EMBODIMENT

Generally, the present invention is a method for selectively placing low-K dielectric material between adjacent conductive elements which require improved electrical isolation due to smaller pitches/separations. This selective placement is performed between dual inlaid contact structures (i.e., Damascene structures). In a first embodiment (FIGS. 6–12), dual inlaid features are formed to expose an underlying conductive layer. A middle portion of the dual inlaid feature is filled with low-K material in a selective/patterned manner. A first dual inlaid contact is formed on a first side of the low-K middle portion and a first dual inlaid contact is formed on a second side of the low-K middle portion whereby the presence of the selective middle low-K portion provides superior electrical isolation between the first and second dual inlaid contacts. Other embodiments for forming selective low-K dielectric regions in critical areas of a dual inlaid contact structure are also discussed herein via FIGS. 13–19, FIGS. 20–25, and FIGS. 26–31.

Since the low-K dielectric portions are located only in critical areas of the devices in the embodiments of FIGS. 6–12, FIGS. 13–19, FIGS. 20–25, and FIGS. 26–31, the low-K material's affect on the ICs mechanical strength is minimized. Also, the restriction on subsequent temperature processing is not as severe in these embodiments, while the thermal conductivity of the final device is also improved. The thermal conductivity is improved in the IC's vertical direction since there are "pockets" of normal higher-K oxide in non-critical areas that allow for adequate thermal dissipation away from active circuitry during device operation. Furthermore, affects of moisture absorption, out-gassing, low-K dielectric material flow, and geometrical changes in low-K dielectric shape are reduced. In general, the disadvantages of low-K dielectric material IC design are lessened in severity or eliminated while the full benefit of low-K material is obtained in more advanced dual in-laid interconnection structures.

The present invention can be best understood with reference to the FIGS. 6–31.

Figure 6:
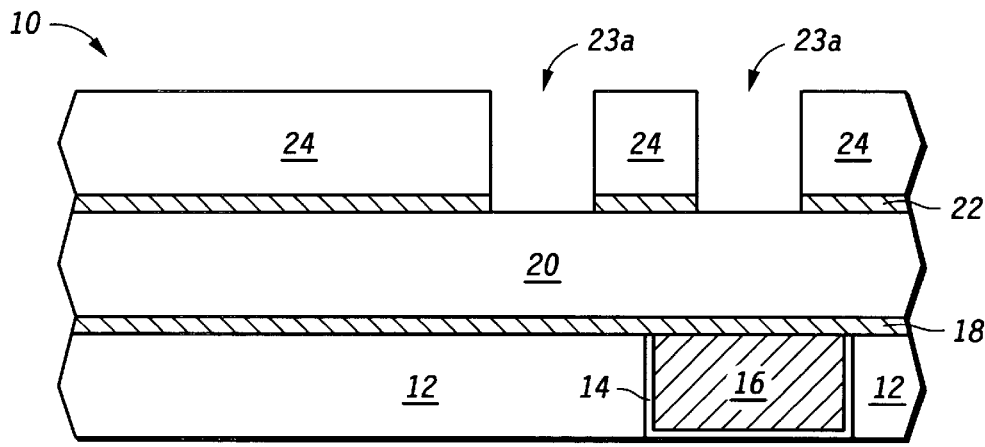
FIGS. 6–12 illustrate, in cross-sectional diagrams, a method for selectively forming low-K dielectric material in a dual inlaid contact process in accordance with the present invention.

FIG. 6 illustrates, in cross-sectional view, a partially completed semiconductor device 10. The semiconductor device 10 comprises a substrate which is not shown in FIG. 6. In the integrated circuit (IC) industry, typical substrates include, silicon wafers, germanium, gallium arsenide, silicon on insulator (SOI), silicon germanium, silicon on sapphire (SOS), and the like. In FIG. 6, an oxide layer 12 is illustrated. As taught herein, typical inter-level dielectric (ILD) layers include, tetraethylorthosilicate (TEOS) glass, fluorine-doped $SiO_2$, borophosposilicate glass (BPSG), phosphosilicate glass (PSG), plasma enhanced nitride (PEN), spin-on glasses (SOGs), silane glasses, the like, and combinations thereof. A conductive region 16 is illustrated in FIG. 6. Typical conductive interconnect bulk materials include copper, aluminum, aluminum copper, aluminum silicon copper, silver, gold, aluminum silicon, copper alloys, and the like. Many conductive bulk materials use barrier layers such as the barrier layer 14 of FIG. 6. Barrier layers may comprise alloys such as Ti/W, TaN, TiN, or TaSiN, TiSiN, WN, the like, and combinations thereof.

FIG. 6 illustrates an etch stop layer 18. The etch stop layers taught herein are comprised of one or more of plasma deposited silicon nitride (PEN), silicon oxynitride (SiON), other dielectrics comprising nitrogen, or the like. These materials perform the functions of: etch stop layers for reactive ion etching (RIE) or wet etching; anti-reflective coatings (ARCs) for photolithography; corrosion protection; and moisture and alkali metal contamination protection. FIG. 6 illustrates an oxide layer 20 which is similar to the layer 12 discussed hereinabove. FIG. 6 also illustrates an etch stop layer 22 which is similar to the layer 18 discussed herein. Atop of the etch stop layer 22 is an oxide layer 24. Layer 24 is similar to the layers 12 and 20 and is shown to have been deposited and patterned to create features 23a therethrough. The features 23a are contact-sized openings typically on the order of 1 micron to 0.1 microns in dimension. The patterned features 23a have been created by etching through a developed photoresist mask, not shown in FIG. 6, by using chemistries such as $CF_4$ and/or $CHF_3$ to expose a portion of the etch stop layer 22. Next, other etch chemistries (such as a plasma supplied with both $CF_4$ and $O_2$) are used to etch the exposed portions of the etch stop layer 22 as shown in FIG. 6. The resist mask used to form regions 23a and not specifically illustrated in FIG. 6 is then removed.

Figure 7:
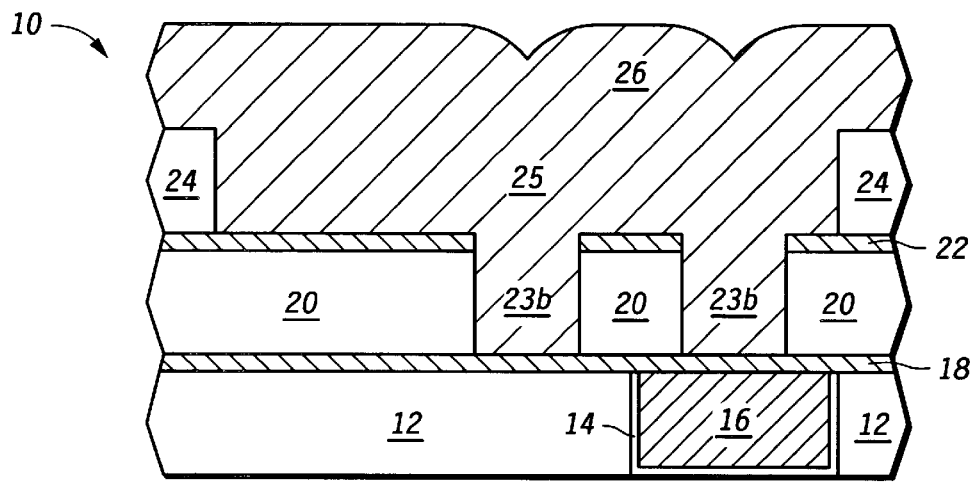

In FIG. 7, another photoresist mask (not specifically illustrated in FIG. 7) is spun-on and developed to allow for both the etching of dual-in laid interconnect trenches and the deepening of the contact openings 23a into the layer 20. Therefore, in FIG. 7, portions of the oxide 20 which are exposed by the openings in the etch stop layer 22 (see FIG. 6) are etched away thereby deepening the openings 23a of FIG. 6 to a deeper opening 23b of FIG. 7. While deepening the opening 23a to form the deeper opening 23b, the same plasma oxide etch environment is removing portions of the layer 24 to form an interconnect portion 25 of the dual inlaid contact structure. The resulting structure is a trench/interconnect region 25 and via/contact regions 23b which together form a dual inlaid structure that exposes a portion of the etch stop layer 18 above the conductive region 16.

It is important to note, in an alternative embodiment, that it would be possible to leave the etch stop layer 22 of FIG. 6 intact until after the forming of the second photoresist layer which will be used to define the trench region 25 in FIG. 7. After this second photoresist layer is formed in FIG. 7, a nitride etch can be used before the oxide etch is begun in order to remove exposed portions of the etch stop layer 22 in FIG. 7 rather than in FIG. 6 as illustrated herein. This would be beneficial in a situation where the anti-reflective (ARC) properties of the etch stop layer 22 are needed during additional dual inlaid photolithographic processing.

Following the formation of the dual inlaid trench region comprising openings 23b and 25, a low-K dielectric material 26 is blanket-deposited across the entire semiconductor device 10. Typically, the low-K dielectric material 26 can be deposited as a spin-on material (i.e., a spin on glass (SOG)), deposited via a plasma enhanced chemical vapor deposition (CVD) process, or be a chemical vapor deposited polymer dielectric film. The low-K material 26 could also be laminated onto the device 10. Choices for the material 26 include, but are not limited to, spin-on polymers such as polyarylethers and fluorinated polyarylethers, polyimides and fluorinated polyimides, benzocyclobutenes and fluorinated thermosets.

The process of FIG. 7 can also involve the use of CVD and PECVD processing to form polymers such as fluorinated amorphous carbon, parylene, perfluorinated parylene, teflon, polynapthalene and fluorinated polynapthalene, and/or methylsilsesquioxane. The low-K dielectric material 26 should be able to fill gaps formed by the via structures 23b, and additionally needs to be a low-K dielectric material for enhancing electrical isolation. For purposes of the present invention, any material which has a dielectric constant less than that of the surrounding oxide would be considered a low-K dielectric material. Generally, it would be beneficial to have the low-K dielectric material 26 within a dielectric constant ($\epsilon$) range of 1.5–3.0 (e.g., less than 3.0). Note that "low-K" as used herein is synonymous with "low permittivity." Following the deposition of the low-K dielectric material as illustrated in FIG. 7, a chemical mechanical polishing process (CMP), resist etch back (REB) methodology, or a like etch back process is performed to planarize the low-K material to approximately the top surface of the oxide layer 24 (see FIG. 8).

Figure 8:
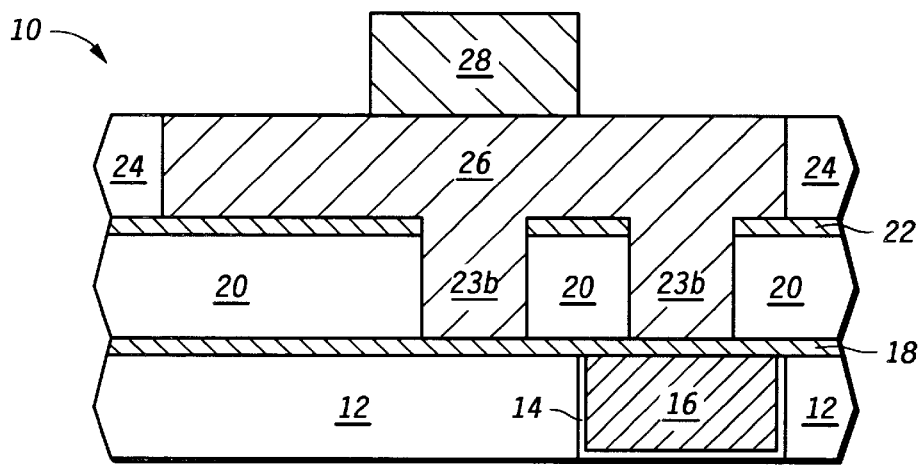

Subsequently, as illustrated in FIG. 8, a photoresist mask 28 is formed to define where the low-K material is to selectively reside within the trench region 25 in the final product. A low-K etch chemistry is used in FIG. 9 to form a low-K dielectric plug 30 from the layer 26 by removing the low-K dielectric material not protected by the photomask 28 of FIG. 8.

Figure 9:
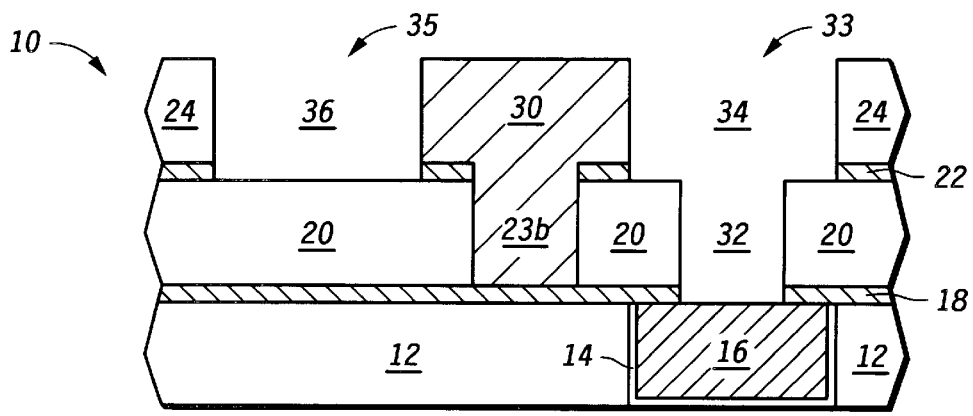

In FIG. 9, a resultant structure from the low-K material etching of FIG. 8 is illustrated. The structure of FIG. 9 shows two distinct conductive dual inlaid contact structures 33 and 35. The two dual inlaid contact portions 33 and 35 are separated by the low-K region 30. Region 33 has a via/contact portion 32 exposing the underlying conductive region 16 and the interconnect trench 34. The dual inlaid structure 35 is illustrated in FIG. 9 as comprising interconnect region 36. All typical dual-inlaid structures have at least one interconnect trench portion and contact to at least one contact/via portion.

Figure 10:
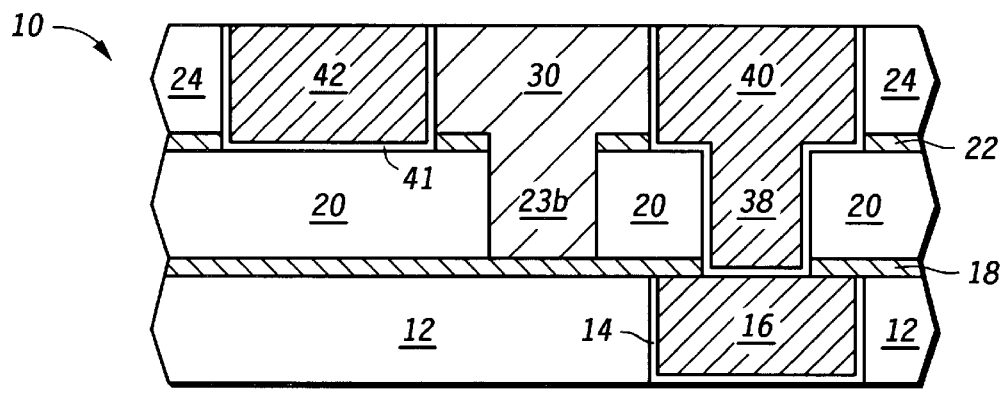

FIG. 10 illustrates that the regions 32, 34, and 36 are filled-in via a blanket sputter process, plating, or CVD deposition process of a metallic layer which contains an optional barrier layer 41 as taught herein. It should be understood that the via region 32 as well as the interconnect regions 36 and 34 will be formed as part of a common process such as a blanket fill across the entire semiconductor device 10 followed by a chemical mechanical polishing (CMP) or resist etch back (REB) operation.

Figure 11:
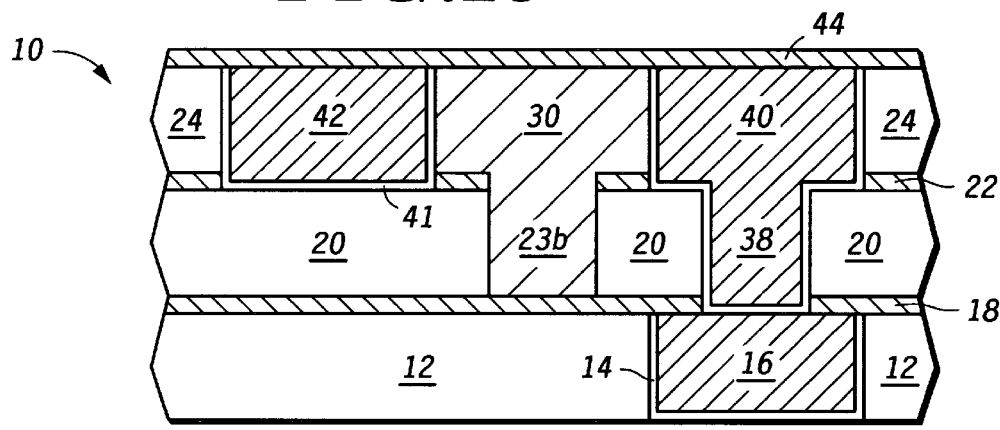

A final, single-level, dual inlaid, semiconductor device 10 is illustrated in FIG. 11 and illustrates the device of FIG. 10 following the application of a passivation layer 44. It should be understood that the passivation layer 44 could be another etch stop layer similar to layers 18 and 22 previously discussed in order to enable further dual inlaid layers over the device of FIG. 11. However, layer 44 may be an anti-reflective coating (ARC) material and/or final passivation wherein layer 44 would represent the top of a finished device which overlies bond pad regions.

Figure 12:
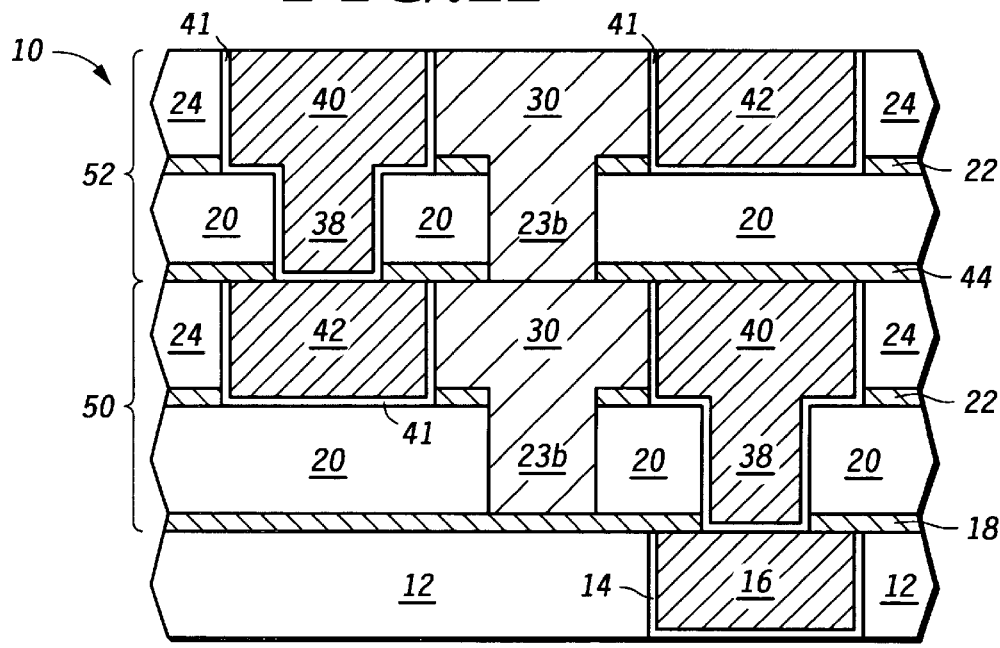

FIG. 12 illustrates the semiconductor device from FIG. 11 wherein the previously discussed process of FIGS. 6–11 has been repeated to form an additional layer of metal over the structure of FIG. 11. Specifically, FIG. 12 illustrates a first interconnect layer 50 from FIG. 11 which is similar in formation to the second interconnect layer 52 which overlies the first interconnect layer 50. In this manner, it is illustrated how multiple layers of metal using the low-K dielectric regions can be manufactured. It is important to note that the low-K dielectric material 30 of FIG. 12 can flow contiguously between vertically-stacked layers of metal in a vertical manner so that fringe capacitive coupling and fringe cross-talk is reduced as well as parallel plate capacitive coupling. In another form, the material regions 30 of FIG. 12 can be substantially contiguous in that the regions 30 are only separated by a thin regions of material having a thickness of 1000 Angstroms or less (e.g., separated only by a region analogous to regions 18, 22, and/or 44).

In other words, one advantage illustrated in FIG. 12 that is superior to the prior art is that a contiguous or substantially contiguous vertical column of low-K dielectric material can be vertically formed to isolate multiple layers of metal interconnect areas at multiple metal levels. Specifically, the low-K dielectric region 30 forms a vertical structure beginning at the etch stop layer 18 of FIG. 6, up through the top of the semiconductor device 11. As a result, not only would the parasitic parallel plate capacitance which forms directly between the interconnects 42 and 40 be reduced by the critical positioning of the low-K material 30, but the parasitic fringe capacitance which forms above and below this parasitic parallel plate capacitor would also be reduced. This advantage is gained by providing selectively placed vertical columns of higher-K dielectric material so that thermal dissipation and the like is improved over blanket-deposited low-K layers since some lower-K columns remain in the final device. It is important to note that the material 30 may be contiguous in the vertical direction for more than one layer of interconnects or that these high-K regions 30 may be substantially contiguous. "Substantially contiguous" is when the regions 30 are separated by material less than 1000 Angstroms or separated only by the material used to form etch stops such as layers 22, 18, and the like. Most processes in the IC industry today integrate four or more metal interconnect layers, all of which can be isolated via the processes taught herein.

The structures illustrated in FIGS. 6–12, are understood to have been discussed in a generic nature. However, it would further be understood that the conductive structures 16, 42, and 40 could be formed of specific material such as copper in a preferred form. When copper is used as a bulk metal interconnect material, a protective barrier such as a tantalum nitride or tantalum silicon nitride would encase the conductive layer in order to protect it from the surrounding oxides. In addition, the etch stop layer 18 would be used to protect the underlying copper from subsequent processing.

Figure 13:
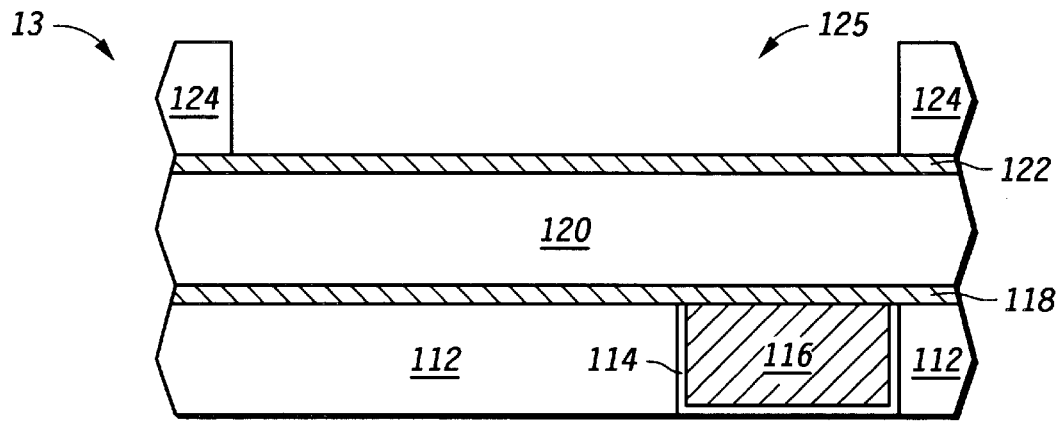
FIGS. 13–19 illustrate, in cross-sectional diagrams, another embodiment for selectively forming a low-K dielectric material between dual inlaid contact structures in accordance with the present invention.

FIGS. 13–19 illustrate a process to form a device 13 which is similar to the device 10 previously discussed via FIGS. 6–11. Dual inlaid structures can be formed in one of two primary manners: (1) via-first and interconnect-trench-last (i.e., a via-first method); or (2) interconnect-trench-first and via-last (i.e., a via-last method). Together, FIGS. 6–11 and FIGS. 13–19 illustrate both of these dual inlaid formation embodiments. Beginning in FIG. 13, an interconnect trench region 125 of a dual inlaid structure is first formed before via openings are patterned. In FIG. 13, a semiconductor device 13 has been provided having an oxide layer 112, a metal conductive region 116 surrounded by a protective barrier 114, an etch stop layer 118, an oxide layer 120, and an etch stop layer 122. Subsequent to the forming of the etch stop layer 122, an oxide layer 124 is formed. Following the formation of oxide layer 124, a photoresist layer (not illustrated in FIG. 13) is formed and patterned in order to allow for etching of the trench region 125. The trench region 125 exposes a portion of the etch stop layer 122.

Figure 14:
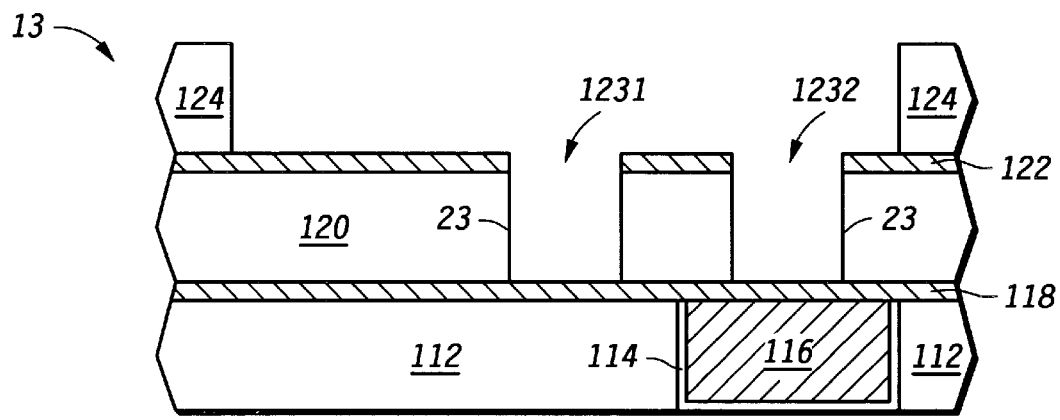

FIG. 14 illustrates the structure 13 following the removal of the photoresist layer used to form the trench region 125 of FIG. 13.

Figure 4:
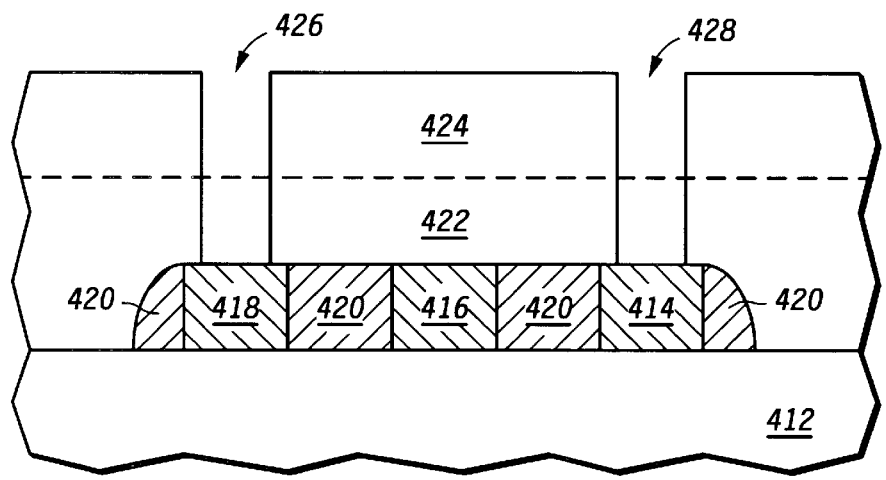
Figure 5:
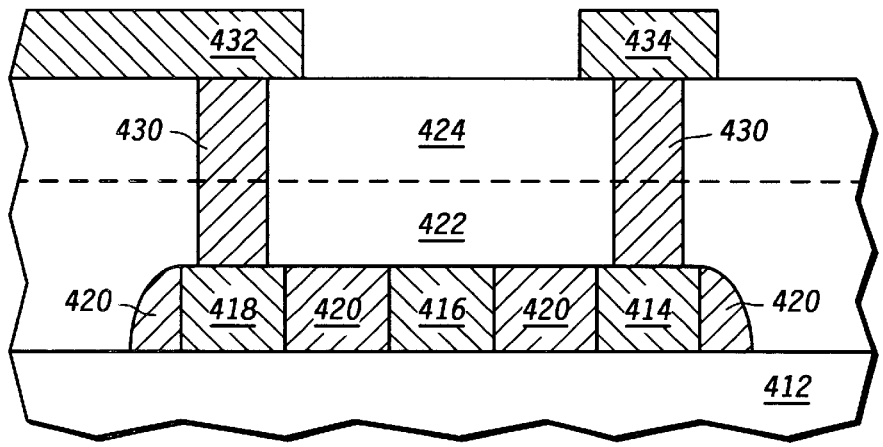

In FIG. 14, another photoresist mask (not specifically illustrated in FIG. 4) is formed for defining the via openings 1231 and 1232. The vias 1231 and 1232 are formed such that they expose portions of the etch stop layer 118. In one embodiment, it would be possible to continue the etch process using the current photoresist layer such that the exposed portions of the etch stop layer 118 are removed. In this situation, it may be necessary to provide a subsequent metal protective barrier, not shown in FIG. 14, in order to assure subsequent processing steps from FIGS. 14–17 do not adversely interact with the metal material present in the interconnect 116. In another embodiment, the etch stop layer 118 would remain in place in FIG. 14 until subsequent processing steps are taken (see FIG. 17) to remove these exposed portions of layer 118. The advantage of etching through the etch stop layer in FIG. 14 would be that possible reduction of fringe capacitance between interconnect structures could be realized by deepening the openings of FIG. 14 into layer 112. However, due to the relative thickness of the etch stop layer, which is generally around 1,000 Å or less, it is not believed that the parasitic fringe capacitance between adjacent conductive elements would be adversely increased as a result of leaving the thin etch stop layer in its present form within the opening 1231. The via hole photoresist mask is removed after the etch processing of FIG. 14.

Figure 15:
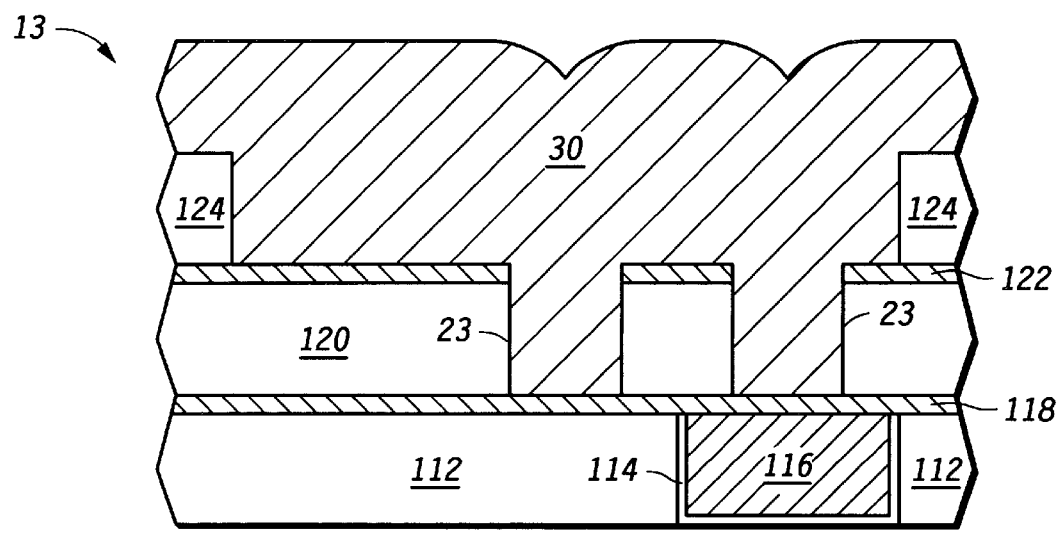

FIG. 15 illustrates the structure 13 of FIG. 14 following the formation of a low-K dielectric blanket layer 30 atop the entire structure 13. Note that the low-K dielectric material 30 of FIG. 15 fills the trench 125 and the contact openings 1231 and 1231 as illustrated. The material used for layer 30 is any material with a dielectric constant less than or equal to roughly 3.0 as taught hereinabove.

Figure 16:
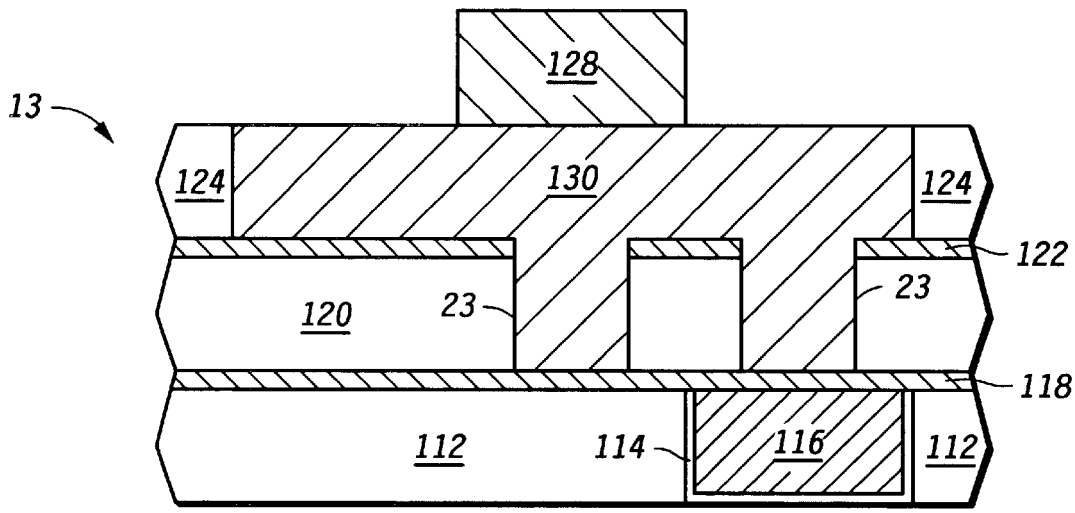
Figure 17:
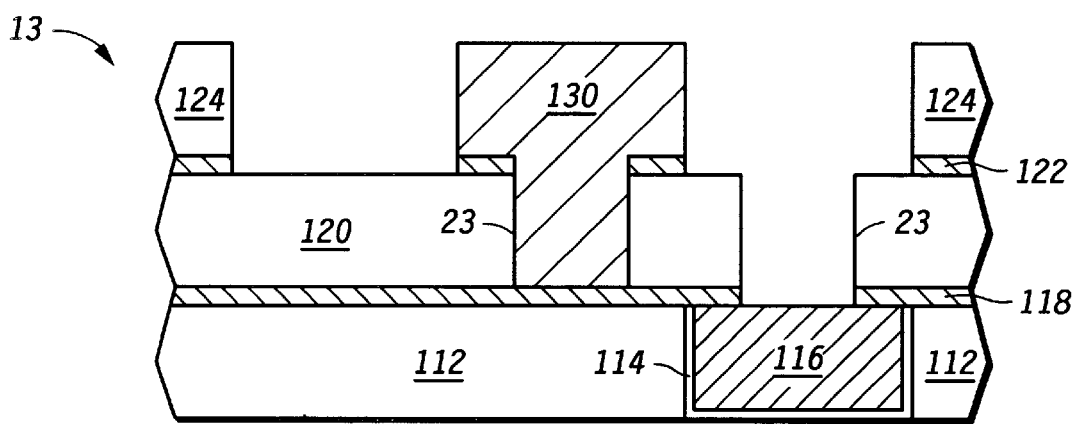

FIG. 16 illustrates the device 13 following a planarization of the low-K dielectric material 30 via CMP processing or REB processing. Due to planarization of the material 30 from FIG. 15, the layer 30 is made to be substantially planar with a top surface of the surrounding dielectric regions 124 to form a planar region 130. FIG. 16 illustrates the formation and patterning of a new photoresist mask layer 128. The mask region 128 defines the location of the low-K dielectric plug so that a middle portion of the trench region 125 will contain a low-K plug 130 (see FIG. 17). Etching is performed, subject to the selective protection of the masking layer 128. whereby the low-K dielectric plug 130 is formed as illustrated in FIG. 17. The high-K dielectric plug 130 separates two dual inlaid structures as is the case in FIG. 9 hereinabove.

Figure 18:
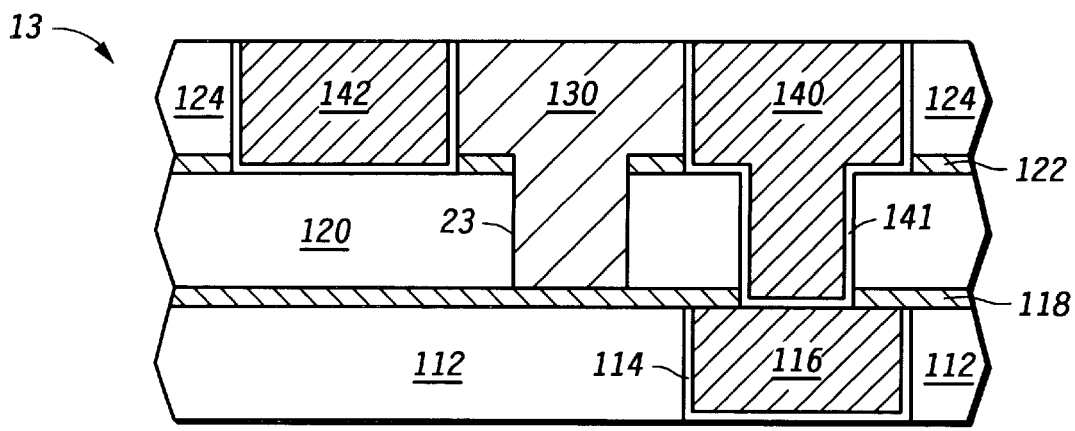
Figure 19:
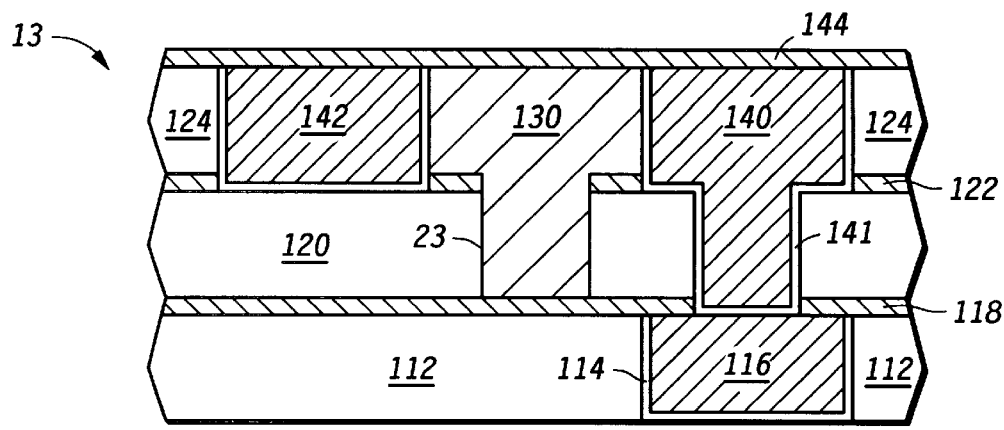

In FIG. 18, a blanket sputtered, plated, or CVD layer of metal with appropriate barrier layers is formed so that two dual inlaid metal interconnects 142 and 140 are formed after CMP or REB processing. Specifically, the interconnect 140 and the via region 141 have been formed such that they would make electrical connection with the interconnect layer 116 whereby metal N−1 is routed properly to metal N (N being a finite positive integer greater than one). A final passivation layer 144 is formed in FIG. 19 in a manner similar to the passivation layer previously discussed with respect to FIG. 11. Therefore, FIGS. 6–12 illustrate a via-first, dual inlaid, selectively-positioned low-K dielectric process while FIGS. 13–19 illustrate a via-last, dual inlaid, selectively-positioned low-K dielectric process which provide improved isolation while limiting the space occupied by low-K material whereby the impact of the disadvantages of low-K material is minimized.

It will be understood by one skilled in the art that the process of FIGS. 13–19 could be easily integrated in multiple-metal-level processing in order to form multiple metal interconnect layers on top of one another wherein there is a substantially continuous column of a low-K dielectric material as previously shown in FIG. 12. As discussed herein, a substantially continuous vertically-oriented low-K dielectric region could contain multiple layers wherein the layers would include the low-K dielectric material as well as a thin etch stop regions.

A continuous/contiguous column of low-K material void of any other material (such as etch stop material) could be created by adding additional processing to protect the interconnect portions 116 after removing the etch stop layer 118 or by using additional masking and etching steps. An electroplating, or electroless plating, step can be done to deposit a thin layer (thickness≦400 Å) of Cobalt (Co) or Nickel (Ni) on top on the metal interconnect feature 116. The Co or Ni layer would protect the interconnect portion 116 during subsequent processing so that layer 118 can either be removed selectively or avoided altogether in the process sequence. Therefore, the regions 130 and 30 taught herein can be vertically-coupled together to create long vertical low-K regions between multiple metallic layers with or without small breaks due to etch stop, polish stop, ARC, or like layers. Vertical low-K regions with no intervening etch stop or like layers are referred to as contiguous layers whereas vertically stacked regions of low-K material separated by thin layers (≦1000 Å) or separated by etch stop layers, polish layers, ARC layers, or the like are referred to as being "substantially contiguous." It has been determined that the small fringe capacitance increases due to intermittent breaking of contiguous low-K material by other more-higher-K material is not overly significant and can be tolerated in current IC processing.

Figure 20:
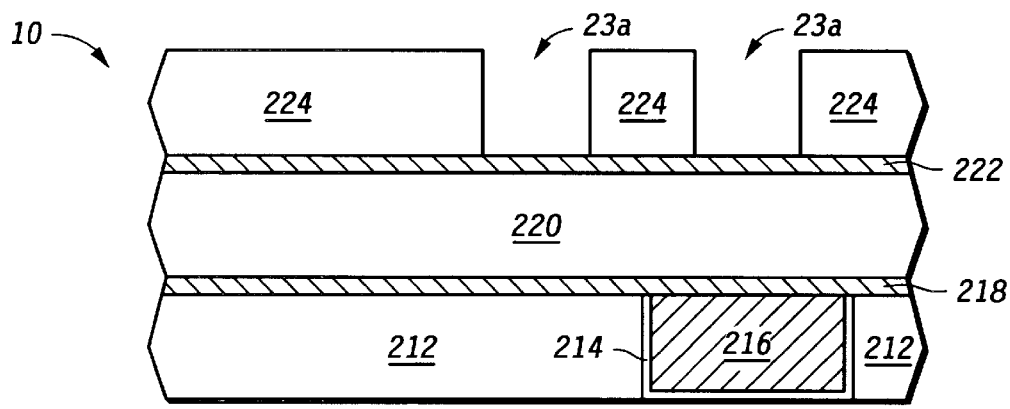
FIGS. 20–25 illustrate, in cross-sectional diagrams, yet another embodiment which can be used for selectively forming low-K dielectric material between dual inlaid contact structures in accordance with the present invention.

FIGS. 20–25 illustrate yet another embodiment of the present invention whereby low-K dielectric regions are selectively formed only in critical electrical isolation regions of an IC device. In FIG. 20, the beginning of a typical Damascene process or dual inlaid process is illustrated.

Figure 21:
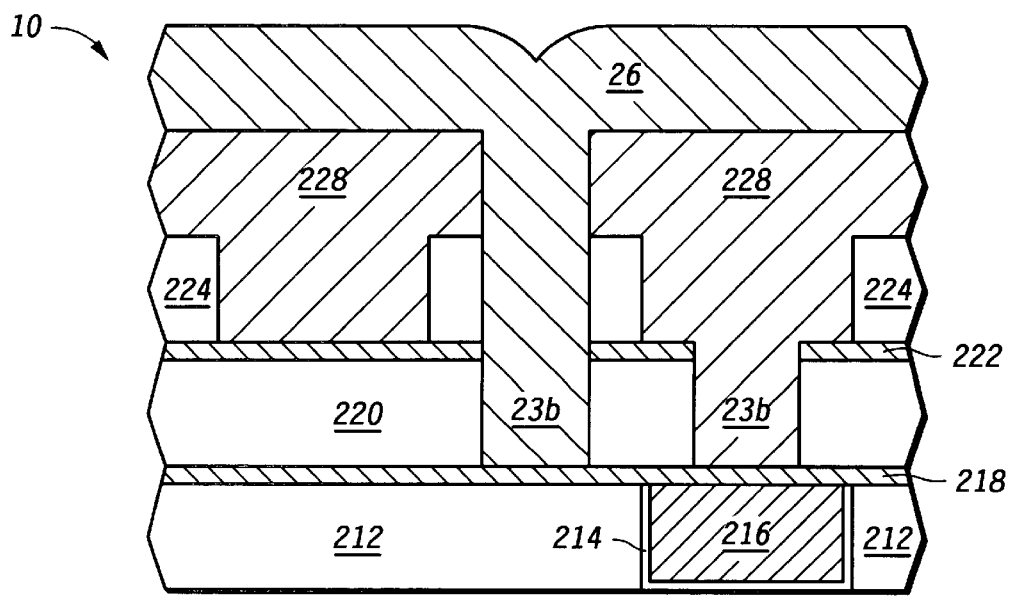

Specifically, multiple masking and etching steps are performed in order to form the two-level trench dual inlaid structures, a beginning of which is illustrated via a first masking and etching step to form the first dual inlaid trench portion 23a. Note that the embodiment of FIGS. 20–25 can be practiced as either a via-first dual inlaid embodiment or a via-last dual inlaid embodiment as taught herein via FIGS. 6–19. Further masking and trenching for dual in-laid trench formation as taught herein is performed in FIG. 20 to form the final trench structures present in FIG. 21. In FIG. 21, a photoresist layer 228 has been deposited and patterned. The resist 228 masks the regions wherein conductive interconnect material is to be subsequently formed to form dual inlaid connections. Also, the resist 228 is eventually patterned/etched to form openings 23b where these openings are used to define locations where low-K dielectric material is to be subsequently formed.

The low-K dielectric trench through region 228 is formed in a central portion of FIG. 21 and is a thin "contact-sized" trench 23b of roughly 0.1 to 1 microns in width. This opening is formed through the resist 228, the layer 224, the layer 222, and the layer 220 as illustrated in FIG. 21. The layer 218 within this opening may be etched or not etched in the low-K trench to either make contiguous or substantially contiguous low-K dielectric regions in the vertical direction. In FIG. 21, the mask 228 has been fully formed, and the low-K dielectric layer 26 has been deposited to fill the low-K dielectric trench 23b as illustrated.

Figure 22:
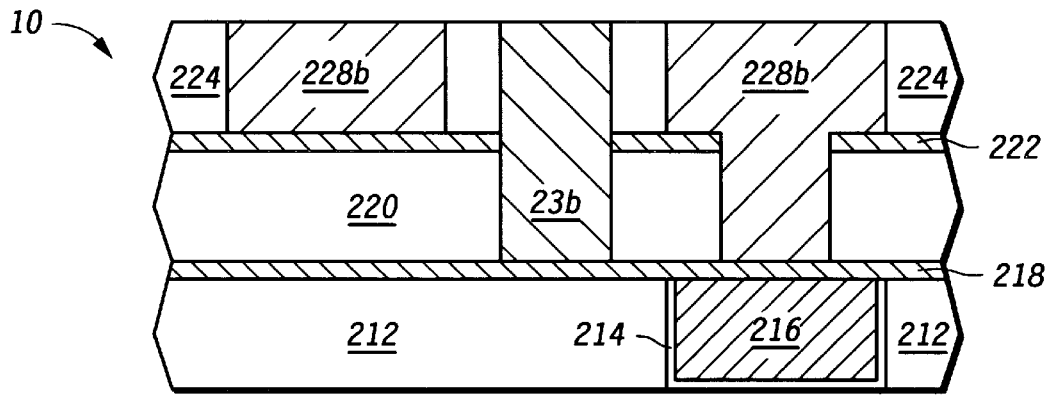
Figure 23:
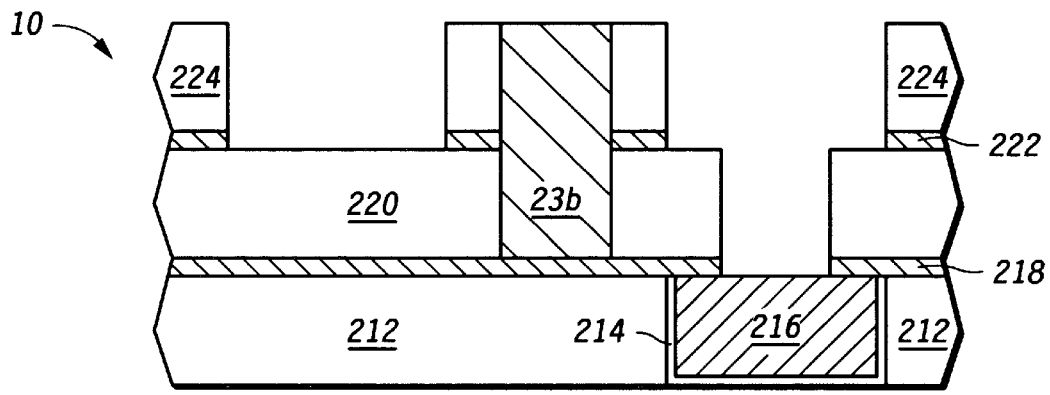

In FIG. 22, both the low-K dielectric layer 26, as well as the photoresist layer 228 residing above the oxide layer 224, has been etched-back or chemically mechanically polished (CMPed) to be substantially parallel with a top surface of layer 224. In FIG. 23, the photoresist layer portions 228b that remain within the dual inlaid via and dual inlaid trench areas in FIG. 22 have been removed selective to the layer 224 and low-K dielectric material 23b by etch/develop processing. In FIG. 23, the etch stop materials 222 and/or 218 are removed as needed to expose region 216 for proper subsequent electrical connections.

Figure 24:
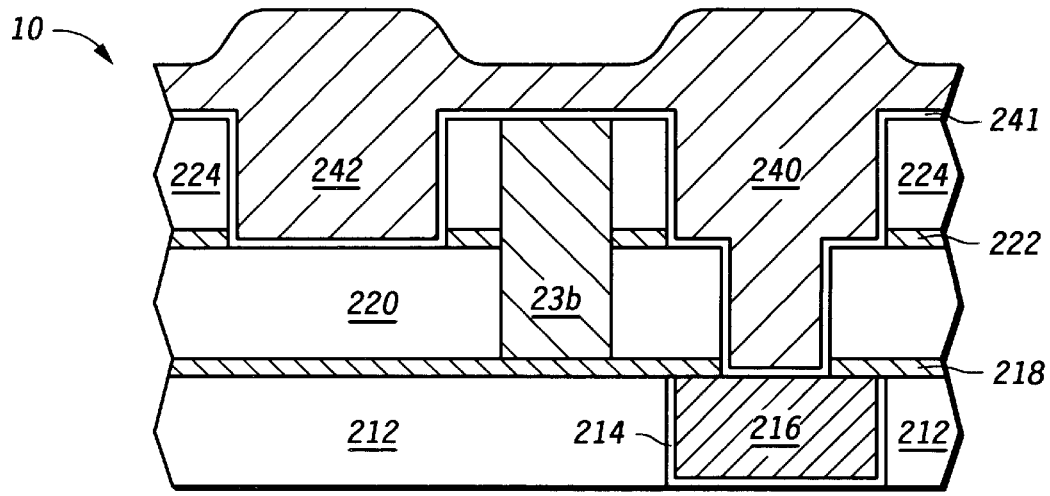
Figure 25:
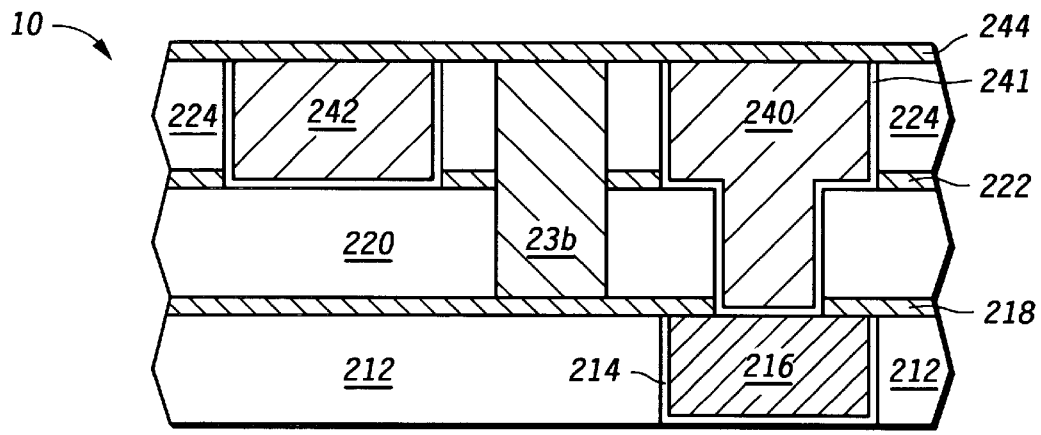

In FIG. 24, a barrier layer 241 has been placed in order to form a first layer of the via and interconnect metal areas. Subsequently, a deposition process, plating, or sputtering process is used to form the bulk metal material which fills trench and interconnect regions 240 and 242 of the dual inlaid structure. Subsequently, an etch back process or CMP process is performed as in FIG. 25, and a passivation layer or another etch stop layer 244 is applied to the wafer to complete the dual inlaid process. Notice that some metal regions (not illustrated in FIG. 25, but located off-the-page) which are laterally adjacent region 240 and 242 are separated from the regions 240 and 242 only by higher-K material while thin/critical regions of dielectric between 240 and 242 are selectively formed to contain either all low-K material or a composite of low-K material 123b and higher-K material 224 to reduce cross-talk.

Figure 26:
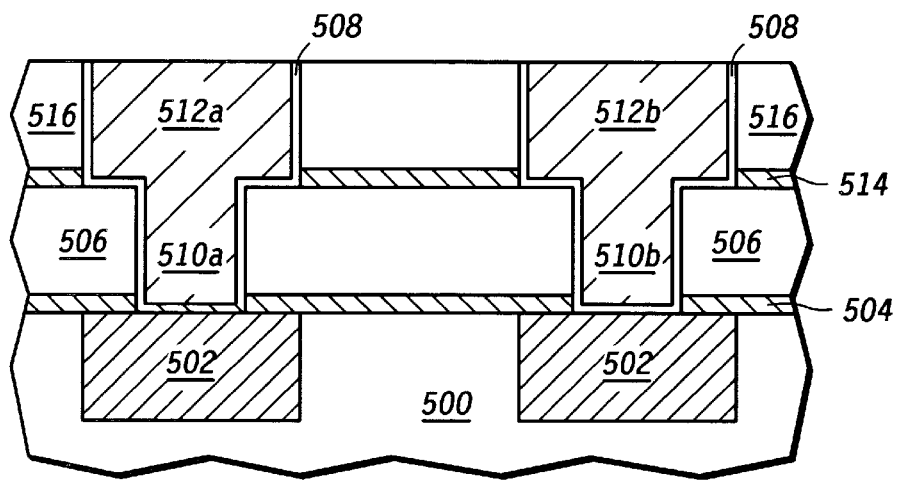
FIGS. 26–31 illustrate, in alternating cross-sectional and top perspective drawings, a process for selectively forming low-K dielectric isolation regions between dual inlaid contact structures in accordance with the present invention.
Figure 27:
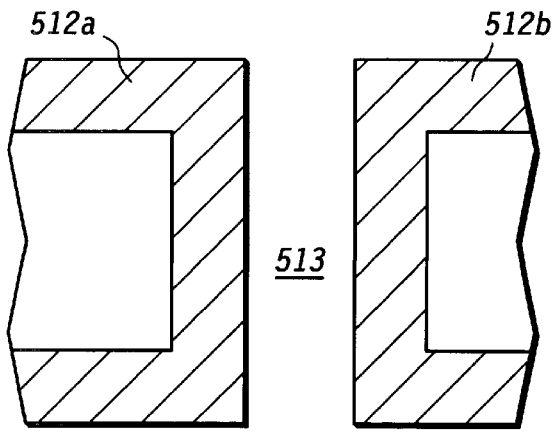

FIGS. 26–31 illustrate yet another embodiment of the present invention. FIGS. 26 and 27 illustrate a cross-sectional and top perspective view respectively of a dual inlaid integrated circuit structure. The structure includes a semiconductor substrate 500, a first level of metal interconnect regions 502, an etch stop layer 504, an oxide or dielectric layer 506 and 507, an etch stop layer 514, an oxide layer 516, and an inlaid metal regions (i.e., inlaid via and inlaid interconnect metal structure) 512a, 512b, 510a, and 510b. In the specific embodiment shown a barrier layer 508 is illustrated for isolating the metal regions 512 and 510 from the adjacent oxide layers. The barrier layers 508 would be a conductive region typically comprising a refractory metal. FIG. 26 may be formed via-first or via-last as taught herein.

FIG. 27 illustrates a top perspective view of the interconnect regions 512a and 512b. As shown, the region 513, which is between the two conductive interconnects 512a and 512b, is an area that is highest in capacitive coupling and highest in cross-talk potential between the two regions 512a and 512b. This area is a critical area which would most benefit from low-K dielectric material placement.

Figure 28:
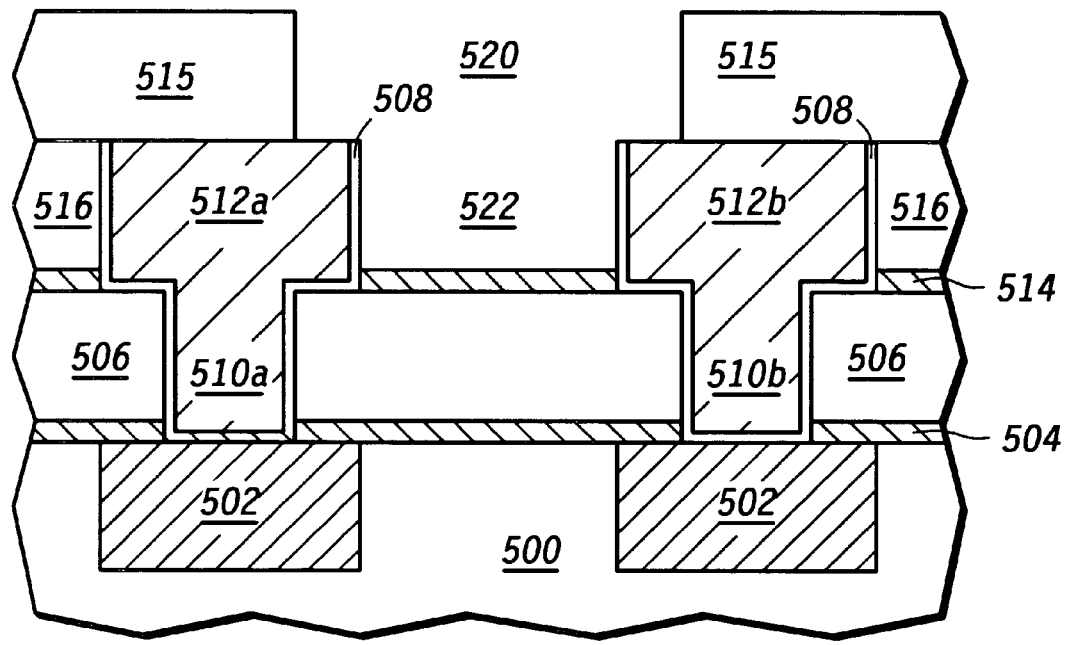
Figure 29:
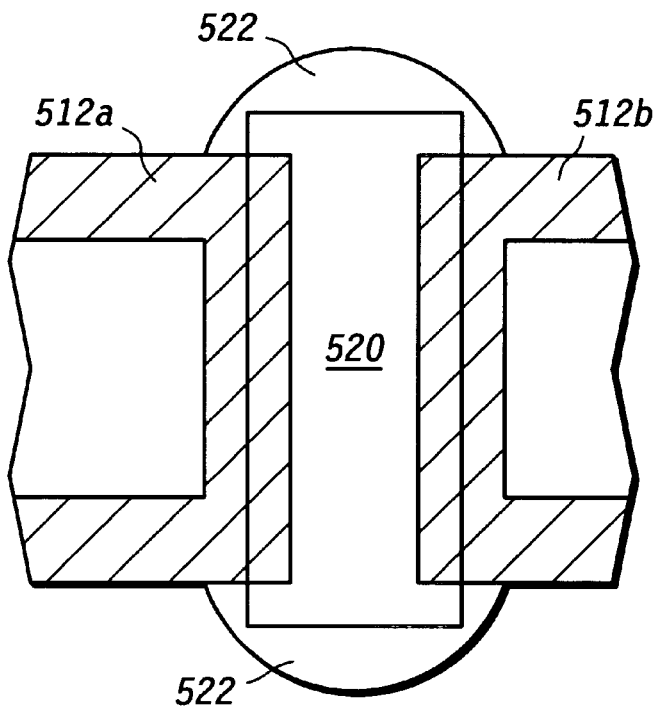

In order to get this selective low-K dielectric placement, the masking layer 515 of FIGS. 28–29 is formed. The layer 515 is either a photoresist layer or a hard mask material such as TEOS. A wet etch process using buffered oxide etchant (BOE) or HF is used to remove exposed portions of the dielectric layer 224 selective to the etch stop layer 514, barrier layer 508, and the conductive material 512a and 512b. Note that the etch chemistry may use a combination of RIE etching and wet etching or RIE etching alone. However, the use of some sort of wet or isotropic etch will form the oval trench 522 in FIGS. 28–29 which will enhance fringe capacitance protection using the low-K dielectric process of FIG. 30–31.

Note that the opening 520 in layer 515 of FIG. 28 can be line-on-line or slightly within with the edges of the regions 512 to avoid exposure of the metal interconnects to RIE etch damage. However, some exposure of the metallic regions 512 to an RIE etch environment or an ion milling process is tolerable. Note that after creating the opening 522 in FIG. 28, this opening can be optionally deepened via RIE etching through the regions 514,506, and 504 directly underlying the opening 522 (see FIG. 30). This deepening of the opening aids in reducing fringe capacitance between regions 512 as taught herein. It is this further deepening of the opening 522 that is illustrated in the final embodiment of FIG. 30, however, just the region 522 of FIG. 28 may be filled with low-K material to get some low-K benefit while totally avoiding any RIE exposure of the layers 512 (an all wet etch or isotropic process could be utilized up to the point illustrated in FIG. 28).

Figure 30:
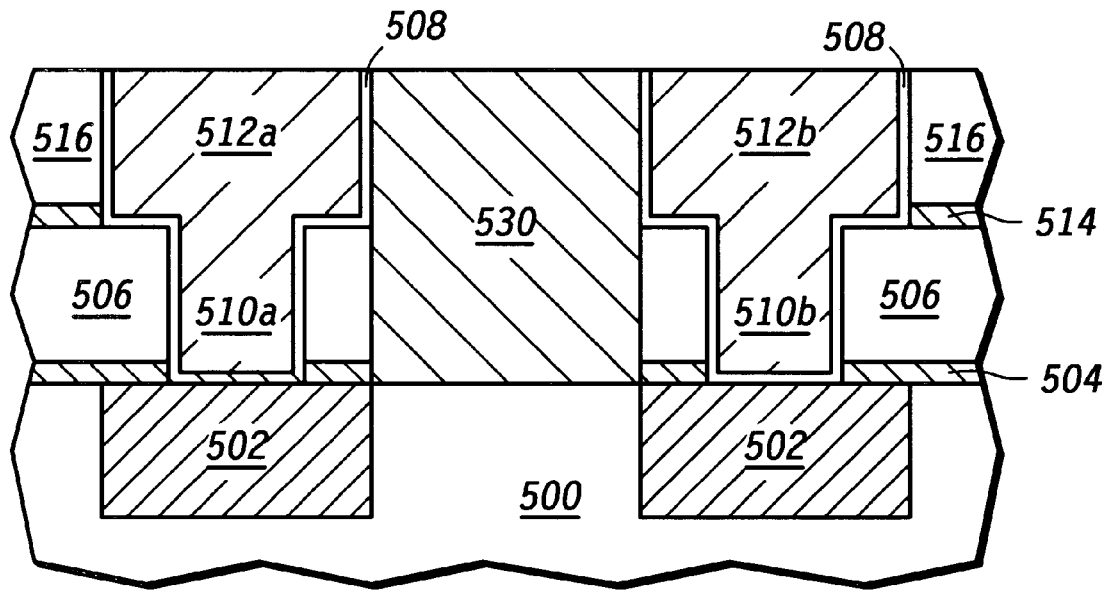
Figure 31:
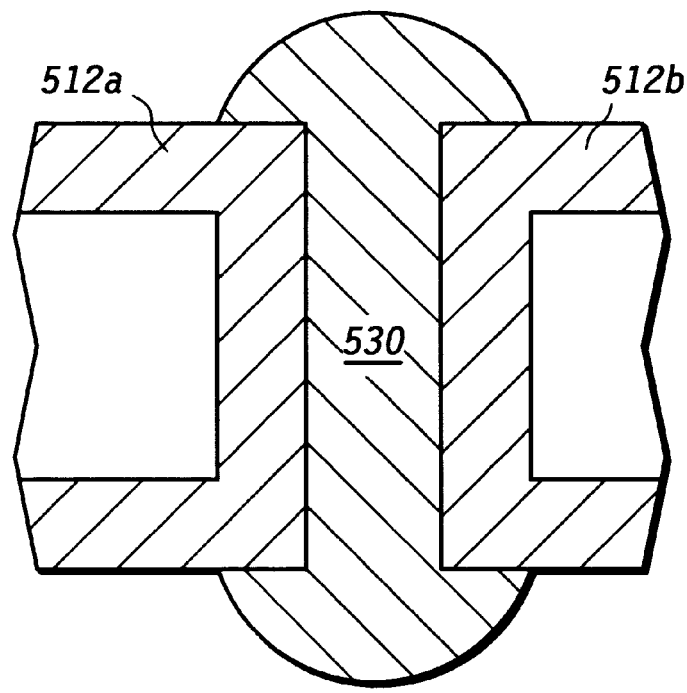

After formation of the opening 522 and the optional deepening of this opening 522 (see FIG. 30), a low-K dielectric material is deposited and polished to form the low-K dielectric region 530 of FIGS. 30–31. Note that the low-K dielectric material is positioned within the critical areas between region 512a and 512b and not within other non-critical areas in FIG. 31. Therefore, all the benefit of low-K material can be obtained in a dual inlaid structure while the disadvantages and limitations of the low-K material are avoided or reduced in magnitude.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A method for forming an integrated circuit structure, the method comprising the steps of:

forming a first dielectric region wherein the first dielectric region is patterned to have an opening having a first sidewall opposite a second sidewall, the first dielectric region comprising a first dielectric material having a first dielectric constant;

etching a portion of the first dielectric material laterally adjacent the second sidewall of the opening to form a void region;

filling the void region with a second dielectric region which has a second dielectric constant that is less than the first dielectric constant; and filling the opening with a conductive material to form a conductive interconnection, the conductive interconnection having a first sidewall in contact with the first sidewall of the opening and a second sidewall in contact with the second sidewall of the opening.

2. The method of claim 1 wherein the step of filling the void region comprises:

depositing the second dielectric region at a temperature less than room temperature, wherein the second dielectric is a low-K dielectric material.

3. The method of claim 1 wherein the step of filling the void region comprises:

depositing the second dielectric region as a low-K dielectric material having a dielectric constant less than or equal to approximately 3.0 by using a chemical vapor phase deposition process.

4. The method of claim 1 wherein the step of etching comprises:

using both plasma etch processing and wet etch processing.

5. The method of claim 1, wherein the step of forming the first dielectric region includes:

forming a first dielectric region having a first dielectric portion and a second dielectric portion overlying each other and separated from each other by an etch stop region, wherein the opening is a dual in-laid structure through the first dielectric portion and the second dielectric portion;

the step of etching the void region includes
etching the void region through both the first and second dielectric portions; and the step of filling the void includes
filling the void with a second dielectric region, wherein the second dielectric region forms a low-K dielectric plug adjacent the dual inlaid structure.

6. A method for forming a contact structure, the method comprising the steps of:

forming a first dielectric region wherein the first dielectric region is patterned to have an opening having a first sidewall opposite a second sidewall;

filling a middle portion of the opening with a low-K dielectric;

filling a portion of the opening on a first side of the middle portion with a first conductive interconnection; and filling a portion of the opening on a second side of the middle portion with a second conductive interconnection.

7. The method of claim 6 wherein the step of filling the middle portion comprises:

depositing a layer of low-K dielectric material in all of the opening;

masking the low-K dielectric material only over the middle portion; and exposing the low-K dielectric material to an etchant to removed portions of the low-K dielectric material to form the low-K dielectric within the middle portion of the opening.

8. The method of claim 6 wherein the steps of filling a portion of the opening on a first and second side of the middle portion comprises:

depositing a contiguous layer of metal; and polishing the metal to form both the first and second conductive interconnections.

9. The method of claim 6 wherein the step of forming a first dielectric region comprises:

forming the first dielectric region having a first dielectric portion and a second dielectric portion overlying the first dielectric portion, the second dielectric portion being separated from the first dielectric portion by an etch stop layer; and etching through the first dielectric region and the second dielectric region to form a dual in-laid contact structure as the opening.

10. A method for forming a contact structure, the method comprising the steps of:

forming a first dielectric layer;

forming an etch stop layer overlying the first dielectric layer;

forming a second dielectric layer overlying the first dielectric layer;

etching openings into the second dielectric layer;

etching the openings to deepen the openings through the first dielectric layer while also forming interconnect openings in the second dielectric layer resulting in a dual-in-laid structure;

depositing a low-K dielectric material within the interconnect openings;

processing the low-K dielectric material to remove portions of the low-K dielectric material in the interconnect openings to form a low-K dielectric middle portion;

depositing a conductive material; and processing the conductive material to form a first conductive interconnect within the interconnect opening and adjacent a first sidewall of the low-K dielectric middle portion and a second conductive interconnect within the interconnect opening and adjacent a second sidewall of the low-K dielectric middle portion, whereby the low-K dielectric middle portion separates the first and second conductive interconnects.

11. The method of claim 10 wherein the step of processing the low-K dielectric material comprises:

using chemical mechanical polishing (CMP) to form the low-K dielectric middle portion.

12. The method of claim 10 wherein the step of depositing the low-K dielectric material comprises:

deposing the low-K dielectric material to form a low-K dielectric plug through both the first and second dielectric layers.

13. A method for forming a contact structure, the method comprising the steps of:

forming a first dielectric layer;

forming an etch stop layer overlying the first dielectric layer;

forming a second dielectric layer overlying the first dielectric layer;

etching interconnect openings into the second dielectric layer;

etching contact openings into the first dielectric layer wherein the contact openings lie within the interconnect openings thereby resulting in a dual-in-laid structure;

depositing a low-K dielectric material within the interconnect openings;

processing the low-K dielectric material to remove portions of the low-K dielectric material in the interconnect openings to form a low-K dielectric middle portion;

depositing a conductive material; and processing the conductive material to form a first conductive interconnect within the interconnect opening and adjacent a first sidewall of the low-K dielectric middle portion and a second conductive interconnect within the interconnect opening and adjacent a second sidewall of the low-K dielectric middle portion whereby the low-K dielectric middle portion separates the first and second conductive interconnects.

14. The method of claim 13 wherein the step of processing the low-K dielectric material comprises:

using chemical mechanical polishing (CMP) to form the low-K dielectric middle portion within the interconnect opening.

15. The method of claim 13 wherein the step of depositing the low-K dielectric material comprises:

deposing the low-K dielectric material with the interconnect opening through the second dielectric layer and at least one contact opening through the first dielectric layer to form a low-K dielectric plug through both the first and second dielectric layers.

16. A method for forming a contact structure, the method comprising the steps of:

forming a first dielectric layer;

forming an etch stop layer overlying the first dielectric layer;

forming a second dielectric layer overlying the etch stop layer;

etching contact openings through the first dielectric layer, and interconnect openings through the second dielectric layer to form a first dual in-laid interconnect structure and a second dual in-laid interconnect structure laterally adjacent one another, the contact openings being surrounded by the first dielectric layer and the interconnect openings being separated by a second dielectric layer middle portion;

forming a masking layer within the first and second dual in-laid interconnect structures;

forming an opening through the masking layer which exposes a portion of the second dielectric layer middle portion;

etching a portion of the second dielectric layer middle portion between the first and second dual in-laid interconnect structure to form a void region; and forming a low-K dielectric within the void region whereby a low-K dielectric plug is positioned between the first and second dual in-laid interconnect structure.

17. The method of claim 16 further comprising the steps of:

polishing portions of both of the low-K dielectric and the masking layer to form the low-K dielectric plug.

18. The method of claim 16 wherein the step of forming the masking layer comprises:

forming the masking layer as a layer of photoresist.

19. A method for forming a semiconductor structure, the method comprising the steps of:

forming a photoresist layer;

forming a low-K dielectric material over the photoresist layer; and chemical mechanically polishing top portions of both the low-K dielectric material and the photoresist layer to form a planar top surface.

20. The method of claim 19 wherein the step of chemical mechanically polishing comprises:

polishing to selectively form a low-K dielectric plug between two dual in-laid contact structures.

* * * * *

UNITED STATES PATENT AND TRADEMARK OFFICE
CERTIFICATE OF CORRECTION

PATENT NO. : 6,143,646
DATED : November 7, 2000
INVENTOR(S) : Jeffrey Thomas Wetzel It is certified that error appears in the above-identified patent and that said Letters Patent is hereby corrected as shown below:

Claim 14, column 13, lines 18-19;
    Delete "within the interconnect opening"

Claim 15, column 13, lines 22-25;
    Delete "with the interconnect opening through the second dielectric layer and at least one contact opening through the first dielectric layer"

Signed and Sealed this

First Day of May, 2001

Attest:

NICHOLAS P. GODICI

Attesting Officer     Acting Director of the United States Patent and Trademark Office